United States Patent [19]
Ariyoshi et al.

[11] Patent Number: 5,659,264
[45] Date of Patent: Aug. 19, 1997

[54] TEMPERATURE DRIFT STABILIZED FILTER CIRCUIT

[75] Inventors: Hiromi Ariyoshi, Kariya; Toshitaka Yamada, Okazaki, both of Japan

[73] Assignee: Nippondenso Co., Ltd., Kariya, Japan

[21] Appl. No.: 589,304

[22] Filed: Jan. 22, 1996

Related U.S. Application Data

[63] Continuation of Ser. No. 281,987, Jul. 29, 1994, abandoned.

[30] Foreign Application Priority Data

Jul. 30, 1993 [JP] Japan ................................. 5-208560

[51] Int. Cl.⁶ ............................................. H01L 37/00
[52] U.S. Cl. .......................... 327/513; 327/307; 327/362; 327/552; 330/9
[58] Field of Search ............................ 327/552, 551, 327/553, 554, 555, 341, 342, 343, 344, 345, 346, 512, 513, 307, 362; 330/9

[56] References Cited

U.S. PATENT DOCUMENTS

| | | | |
|---|---|---|---|
| 3,988,682 | 10/1976 | Mikonis | 327/512 |
| 4,110,677 | 8/1978 | Boronkay et al. | 323/19 |
| 4,138,616 | 2/1979 | Turner | 327/512 |
| 4,746,823 | 5/1988 | Lee | 307/601 |
| 5,053,640 | 10/1991 | Yum | 307/296.6 |
| 5,159,277 | 10/1992 | Mount | 327/513 |
| 5,168,210 | 12/1992 | Thus | 323/313 |
| 5,231,315 | 7/1993 | Thelen, Jr. | 327/513 |
| 5,231,316 | 7/1993 | Thelen, Jr. | 327/513 |
| 5,336,942 | 8/1994 | Khayat | 327/513 |
| 5,434,533 | 7/1995 | Furutani | 327/513 |

FOREIGN PATENT DOCUMENTS 6-45112  2/1994  Japan ................................. 327/513

OTHER PUBLICATIONS

Michio Okamura, "Circuit Utilizing Differentiation And Integration", OP Ampu Kairo N Sekkei, pp. 285–286 Sep. 1990.

*Primary Examiner*—Timothy P. Callahan
*Assistant Examiner*—Kenneth B. Wells
*Attorney, Agent, or Firm*—Cushman, Darby & Cushman, IP Group of Pillsbury Madison & Sutro, LLP

[57] ABSTRACT

The output of a filter circuit utilizing a capacitance amplifier circuit is sufficiently stabilized in its temperature characteristics to improve the operational reliability of the circuit. There is provided a DC cutoff filter circuit utilizing a CR circuit constituted by a composite capacitance formed by a capacitance amplifier circuit utilizing an operational amplifier and a series resistor which is grounded to a reference voltage. The reference voltage is a divided voltage output by a voltage follower constituted by an operational amplifier and serves as a virtual ground. Resistors having different temperature coefficients are used. In response to a positive or negative change in the temperature coefficient of the composite capacitance, the reference potential selects the temperature coefficient of the resistors so that the temperature characteristics including those of the amplifier will provide a temperature coefficient which is the reverse of that of the capacitance amplifier circuit, thereby compensating for fluctuation associated with the temperature coefficient of the composite capacitance.

25 Claims, 4 Drawing Sheets

$$C_O = \frac{R1}{R3} \cdot C1$$
$$(R1 = R2)$$

$$V_O(DC) = I_L * R4 + V_R$$

$$\frac{\delta C1}{\delta T} > 0$$

$$\frac{\delta V_O'}{\delta T} < 0$$

$$\frac{\delta C1}{\delta T} < 0$$

$$\frac{\delta VO'}{\delta T} > 0$$

$$\frac{\delta C1}{\delta T} < 0$$

$$\frac{\delta VO'}{\delta T} < 0$$

TEMPERATURE DRIFT STABILIZED FILTER CIRCUIT

This is a continuation of application Ser. No. 08/281,987, filed on Jul. 29, 1994, which was abandoned upon the filing hereof.

BACKGROUND OF THE INVENTION

1. Field of the Invention

The present invention relates to DC component cutoff filter circuits or high-pass filter circuits and, more particularly, to a filter circuit utilizing a capacitance amplifier circuit (C multiplier).

2. Description of the Related Arts

As a capacitance connected to a DC cutoff filter circuit or the like as shown in FIG. 2, a capacitance amplifier circuit can be used, wherein a composite capacitance is formed using an operational amplifier as shown in FIG. 3A. The capacitance amplifier circuit (FIG. 3A) can be considered as a circuit which equivalently amplifies a capacitance by a factor of R1/R3 when resistance R3 is sufficiently smaller than resistance R1. This circuit is widely used because it can be provided utilizing a capacitor having a capacitance smaller than that which is actually needed and it can be made compact as a whole even when it must have a large capacitance. The filter circuit shown in FIG. 2 is constituted by a CR circuit having a composite capacitance and series resistance R4 (the equivalent circuit is shown in FIG. 3B), and its output is current-amplified by a voltage follower of an operational amplifier A2.

However, the capacitance amplifier circuit shown in FIG. 3A has a problem in that even if the operational amplifier A1 used is of a high performance type having a low drift, a drift in the capacitance output voltage is caused by a temperature drift in its offset voltage and offset current, a temperature drift of the capacitor used therein itself and a temperature drift of the resistor used therein itself. This results in a problem that the drift adversely affects the characteristics of the filter, especially the output characteristics when the input signal is very small, thereby reducing the reliability of the device as a whole.

One solution to this problem is to use a resistor having a different drift to compensate for the temperature drift of the capacitor. However, a problem still remains in this case that even though the temperature drift in the capacitor can be canceled, drifts in DC components due to the operational amplifier can not be completely canceled and, as a result, the characteristics of the circuit are not satisfactory especially as those of a filter circuit wherein highly accurate signal processing must be performed.

SUMMARY OF THE INVENTION

It is an object of the present invention to provide the output of a filter circuit utilizing a capacitance amplifier circuit with sufficient stability against temperature changes.

In a filter circuit which comprises a CR circuit constituted by a composite capacitance C synthesized by a capacitance amplifier circuit having an input capacitance, an operational amplifier connected to the input capacitance at a non-inverted input thereof, an output resistor and feedback resistors and series resistance R and which cuts off DC components, the arrangement according to the present invention is characterized by a combination of a reference voltage circuit which obtains its reference voltage at a grounding point of the filter circuit and a resistor included in the reference voltage circuit for generating the reference voltage and for generating a temperature drift in the reference voltage which compensates for a temperature drift in the output voltage of the capacitance amplifier circuit.

The resistors forming part of the capacitance amplifier circuit may be resistors of various materials such as metal film resistors, carbon resistors and thermistors and, when the circuit is implemented on an integrated circuit, diffused resistors or thin film resistors on the surface thereof may be used. Each of these resistors has a temperature coefficient specific thereto, and the ratios of the resistance thereof vary at various temperatures depending on the combination of the materials used. This results in a change in voltage division performed by the resistors and, consequently, a temperature drift in the electric potential of the terminal of interest can be compensated. In circuit configurations which are common products excluding special and expensive circuits such as for precise measurement, however, it is not possible to completely eliminate a temperature drift in an output voltage of interest by way of only compensation in this capacitance amplifier circuit. Therefore, according to the present invention, the ground side of the series resistor connected to the output of the capacitance amplifier circuit is regarded as a virtual ground, and an arrangement is made so that a temperature drift appears in a reference voltage which determines the electric potential of the virtual ground. This temperature drift is obtained by the use of a combination of resistors having different temperature coefficients, and the magnitude of the temperature drift is set so that a stable output voltage having no temperature drift is obtained by correcting a temperature drift in the output voltage. For example, if the drift in the output voltage of the capacitance amplifier circuit is a positive temperature characteristic, i.e., if the voltage is increased with an increase in the temperature, the reference voltage is generated by arranging resistors having different temperature coefficients such that a negative temperature drift appears at the reference voltage, i.e., the virtual ground potential is decreased by the same degree with the increase in the temperature. The arrangement of the resistors having different temperature coefficients can be made in various combinations and will be specifically described later with reference to a preferred embodiment of the present invention.

With the arrangement according to the present invention, a temperature drift at the capacitance amplifier circuit is compensated by a temperature drift at the reference voltage circuit. Thus, the capacitance amplifier circuit provides very stable apparent output and, therefore, the filter circuit exhibits stable and highly accurate operations. Therefore, the present invention can be advantageously applied to filters for very small signals and the like.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings, of which.

DETAILED DESCRIPTION OF THE EMBODIMENTS

The present invention will now be described with reference to a preferred embodiment thereof.

Figure 1:
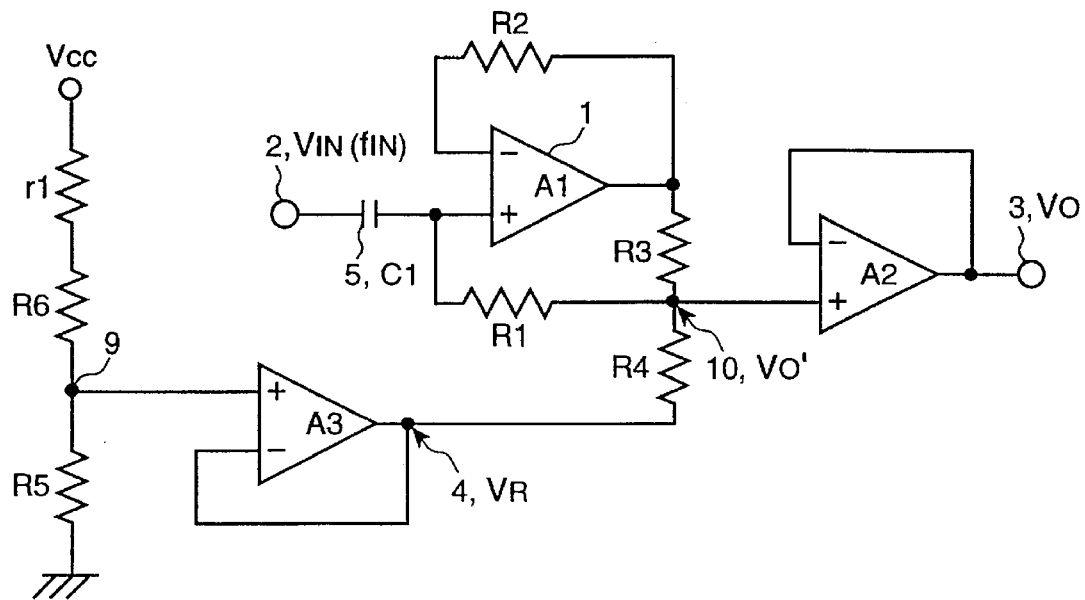
FIG. 1 is a circuit diagram of a filter utilizing a capacitance amplifier circuit wherein temperature compensation is performed at a virtual ground thereof.
Figure 2:
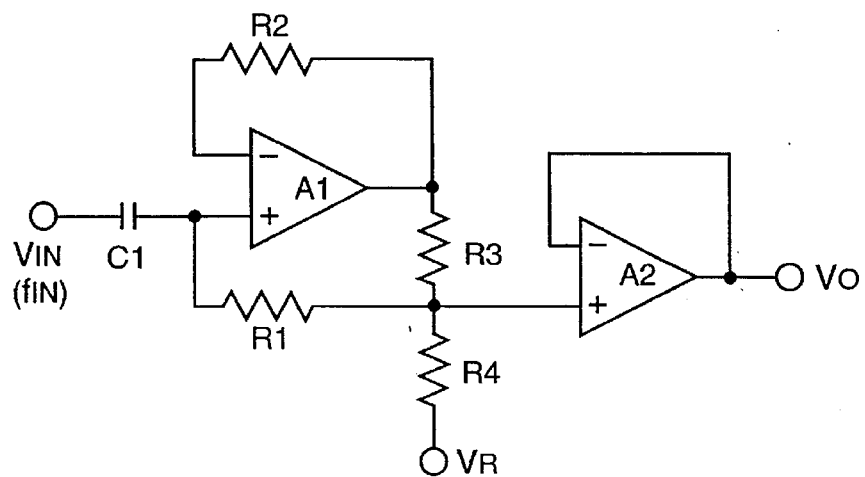
FIG. 2 is a circuit diagram of a filter utilizing a related capacitance amplifier circuit.

FIG. 1 is a circuit diagram of a DC cutoff filter circuit according to an embodiment of the present invention wherein a capacitance amplifier circuit is formed by an operational amplifier A1 (designated by reference numeral 1 in FIG. 1), a capacitor C1 (designated by reference numeral 5 in FIG. 1), feedback resistors R1 and R2 and an output resistor R3 to provide a composite capacitance $C_o$. One of the ends of the capacitor C1 serves as an input terminal 2 and the other end is connected to a non-inverted input of the amplifier A1. The output of the amplifier A1 is fed back from the output resistor R3 through the feedback resistor R1 to the non-inverted input. The resistor R2 is a negative feedback resistor having the same value as the resistor R1. The output resistor R3 is connected to a series resistor R4. The other end of the resistor R4 is grounded to a reference voltage $V_R$ (designated by reference numeral 4 in FIG. 1) of a virtual ground to be described later. The series resistor R4 forms a CR circuit in combination with the synthesized capacitance $C_o$. A capacitance voltage output $V_0'$ (designated by reference numeral 10 in FIG. 1) is input to an operational amplifier A2 which constitutes a voltage follower as a current booster, and the output 3 of the amplifier A2 appears as an output $V_0$. A reference voltage circuit generating the reference voltage $V_R$ is constituted by a voltage follower wherein a divided voltage 9 established by resistors r1, R6 and R5 connected to a constant voltage source $V_{CC}$ is coupled to a non-inverted input of an operational amplifier A3 to output the reference voltage $V_R$ in a stable manner. This electric potential serves as a virtual ground potential of the above-described CR circuit and provides a DC bias voltage. The resistors represented using "r" are resistors having a temperature coefficient which is different from that of the resistors represented using "R".

Figure 3A:
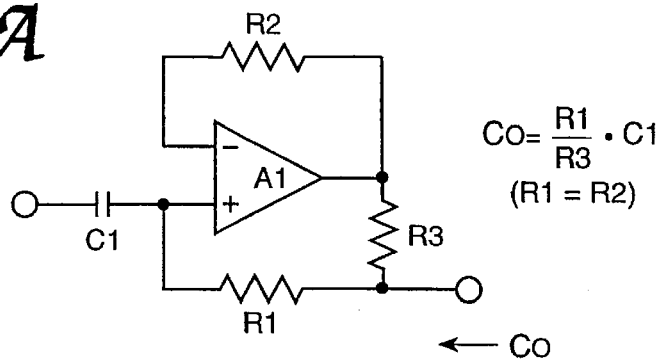
FIG. 3A is a circuit diagram of a capacitance amplifier circuit.
Figure 3B:
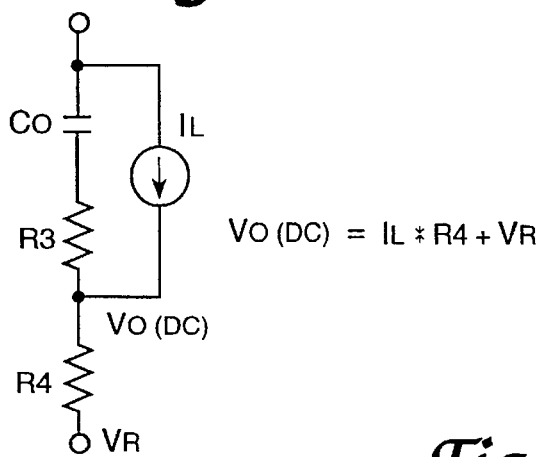
FIG. 3B is a circuit diagram equivalent to the circuit diagram in FIG. 3A.

The operation of the DC cutoff filter circuit is as follows. First, when an input signal Vin is input to an input terminal 2 of this capacitance amplifier circuit, the voltage at the input terminals of the amplifier A1 provides the same electric potential at both terminals. So, the output resistor R3 and feedback resistor R1 divide the output current in accordance with the ratio between the values of these resistors, and the amplifier A1 operates, i.e., amplifies the apparent charge and discharge of the capacitor 5 (C1) as if they are large capacitance values. In other words, the amplified capacitance $C_0$, in combination with the series resistor R4, forms a CR circuit having a large time constant and a cutoff frequency $f_P$ of $1/(2\pi C_0 R4)$ which performs the function of a filter circuit. The operation of this capacitance amplifier circuit is well known (see FIG. 3A and FIG. 3B).

Various types of capacitors may be used as the capacitor 5 (C1) depending on purposes, and they have different capacitance temperature coefficients which may be positive or negative. Therefore, the combination of the temperature coefficients of the resistors in the capacitance amplifier circuit can vary. If an ideal operational amplifier which is perfect and has no drift is assumed, drifts in the entire circuit can be reduced. However, such a perfect amplifier does not actually exist, the performance of the capacitance amplifier circuit depends on how much the drift can be suppressed.

The operation of the reference voltage circuit connected to the virtual grounding point of the above-described CR filter circuit will now be described. This circuit is also a voltage follower, the basic operation of which is well known. The output $V_R$ of operational amplifier A3 is determined by an electric potential which is determined by a reference electric potential at an non-inverted input terminal 9 thereof. Since the output electric potential $V_R$ is determined by the resistors r1, R5 and R6 which determine the electric potential at the non-inverted input terminal 9, the resistance temperature coefficients of these resistors can be selected so that the temperature characteristics of the reference voltage circuit including the temperature characteristics of the amplifier A3 results in a temperature coefficient which is the reverse of the temperature coefficient of the capacitance amplifier circuit. Since the temperature characteristics of the capacitance amplifier circuit are determined by the amplifier A1, capacitor C1, resistors R1, R2, R3 and the like, the coefficient can be either positive or negative. Therefore, if resistors represented using "r" having different temperature coefficients are disposed at the upper side of the divided voltage, an increase in the temperature causes a change in the ratio between the resistors, i.e., a change in the voltage division ratio which causes the output voltage $V_R$ to change. In the present embodiment, it is shown in the circuit diagram that the amplifier used is of a single power supply type, and the virtual ground is not 0 V and also has a function of supplying the reference voltage $V_R$ to the output of the capacitance amplifier circuit as a bias voltage. In other words, a certain bias value is given as the virtual ground, and the temperature coefficient of the bias value is used to compensate for the temperature coefficient of the output of the filter circuit, especially the output $V_o'$ of the capacitance amplifier circuit. Therefore, for a circuit utilizing an amplifier of a two power supply type, it is of course possible to provide the reference voltage circuit with a temperature coefficient even if the reference voltage is generated at the mid point between the positive and negative voltages and the virtual ground point is thereby set exactly at 0 V.

The output voltage $V_0$ at the operating point (the value of the output voltage when the input frequency $f_{IN}$=0) in the circuit diagram in FIG. 1 is given by the following equation.

$$V_O = V_R + (V_{OS} + I_{OS} \cdot R1) \cdot R4/R3 \qquad (1)$$

where $V_{OS}$ represents offset voltage of the amplifier A1 and $I_{OS}$ represents offset current.

$V_{OS}$ and $I_{OS}$ in the second term of this equation have temperature characteristics determined by temperature drifts in $h_{fe}$ and $V_{BE}$ of the transistors in the amplifier. Then, the change caused by a temperature T can be obtained by differentiating the above equation by T as follows.

$$\frac{\partial V_O}{\partial T} = \frac{\partial V_R}{\partial T} + k * \frac{\partial V_{OS}}{\partial T} + R' * \frac{\partial I_{OS}}{\partial T} + \qquad (2)$$

$$I_1 * \frac{\partial R1}{\partial T} + I_3 * \frac{\partial R3}{\partial T} + I_4 * \frac{\partial R4}{\partial T}$$

where $\alpha$ is a differentiation sign and k, R' and $I_i$ (i=1,3,4) represent coefficients.

Therefore, it will be understood that if $\alpha V_R/\alpha T$ is selected so that Equation 2 results in 0, compensation will be performed by canceling the temperature drift in the capacitance amplifier circuit. Since the temperature coefficients are actually given in only rough values, the resistance is set so that the temperature coefficient at the output is minimized by appropriately selecting the types of the resistors used.

If the R-type resistors in FIG. 1 are diffused resistors on an integrated circuit, the temperature coefficient of the resistance is approximately 2000 ppm/° C. while, if the thin film resistors are used as the r-type resistors, their temperature coefficient is approximately 0 ppm/° C. As a result, the division ratio of the voltage Vcc changes with an increase in the temperature to slightly increase the electric potential at the terminal 9 and to increase the electric potential $V_R$ at the virtual ground accordingly. Since the output $V_O'$ of the capacitance amplifier circuit tends to slightly decrease with the temperature rise, fluctuation in the total output $V_o$ can be consequently avoided despite the temperature rise. An example with specific values for calculation will now be given, wherein the output $V_O'$ of the capacitance amplifier circuit is decreased by 1% with an increase in the temperature of 30° C. Then, the voltage at the terminal 9 is calculated on the assumption that, in FIG. 1, Vcc is 12 V; r1 is 5 KΩ, 0 ppm/° C.; R6 is 15 KΩ, 2000 ppm/° C.; and R5 is 10 KΩ, 2000 ppm/° C. The result is that the voltage is 4.00 V if there is no influence of the temperature coefficients of the resistance while a temperature increase of 30° C. results in 4.038 V, i.e., an increase in the voltage of approximately 1%. It will now be understood that the voltage $V_o'$ can be substantially compensated by the use of the configuration of the virtual ground having those constants.

That is, in a case where the temperature drift in the output voltage of the capacitance amplifier circuit has a negative coefficient, to make the temperature drift in the reference voltage positive coefficient, resistors in the reference voltage circuit are arranged such that a resistor having a small temperature coefficient is disposed on the side of the dividing resistance closer to the constant voltage source. On the other hand, in a case where the temperature drift in the output voltage of the capacitance amplifier circuit has a positive coefficient, to make the temperature drift in the reference voltage negative coefficient, resistors in the reference voltage circuit are arranged such that a resistor having a small temperature coefficient is disposed on the side of the dividing resistance closer to the ground.

FIG. 4 through FIG. 8 show examples of several combinations of the configuration of the capacitance amplifier circuit and the configuration of the resistors in the reference voltage circuit. These figures show modifications such as changes in the combination of the temperature coefficients of the resistor at the portion connected to the virtual ground and the resistors determining the reference voltage of the amplifier A3 and the use of a diode. The letters R and r indicates resistors having different temperature coefficients of resistance, and it is apparent that there are various possible combinations for compensation of the temperature coefficients.

Figure 4:
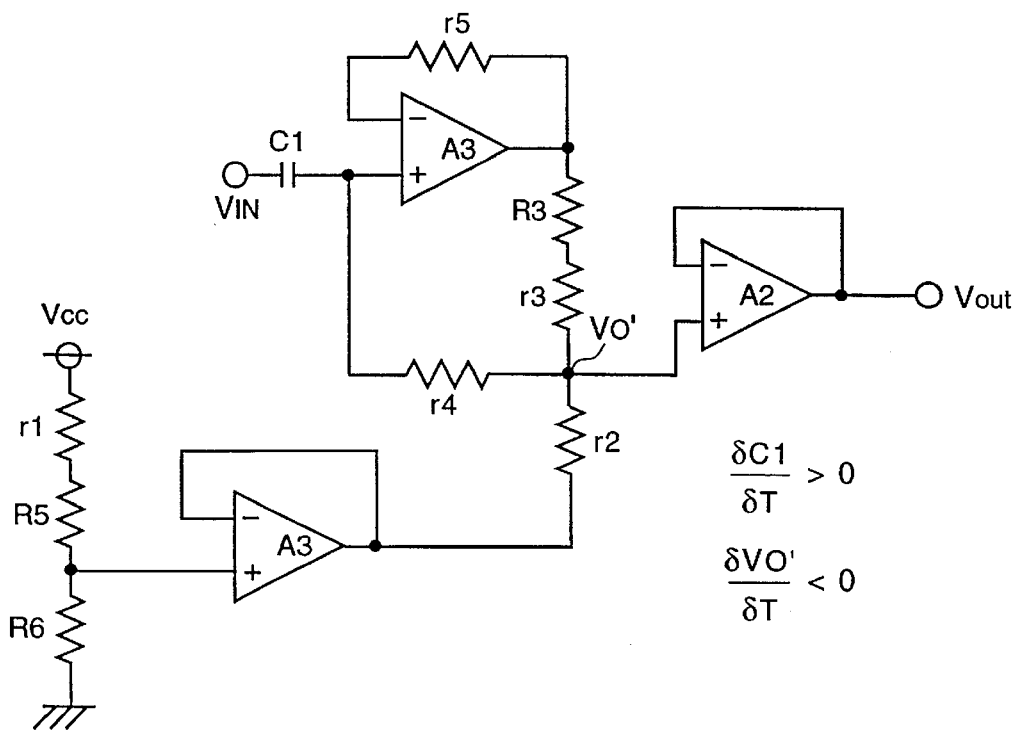
FIG. 4 is a circuit diagram showing a second example of the temperature compensation method.

The circuit shown in FIG. 4 shows a case wherein the temperature coefficient of the capacitance value of the capacitor C1 is positive and the temperature coefficient of the output voltage $V_o'$ of the capacitance amplifier circuit is negative. First, it is assumed that the resistor r2 is not connected to $V_o'$ yet Then, the ratio between the resistance values of the resistors r4, r3 and R3 changes with an increase in the temperature and there is a decrease in the impedance including Vin. This results in a decrease in the electric potential $V_o'$. Although the current flowing through the amplifier A1 which amplifies the capacitance is limited by the resistor R3, the resistance of the resistor R3 is increased as the temperature increases to decrease the apparent capacitance. However, since the change in the capacitance is larger, the temperature coefficient of the electric potential $V_o'$ remains negative. Then, the resistors r1, R5 and R6 are arranged as shown in FIG. 4 so that the temperature characteristics of the virtual ground will be the reverse of the temperature coefficient of the electric potential $V_o'$. As a result, the electric potential $V_R$ of the virtual ground increases with an increase in the temperature. Then, the resistor r2 is connected to electric potential $V_o'$ to compensate for the value of the electric potential $V_o'$, which eliminates fluctuation associated with the temperature.

Figure 5:
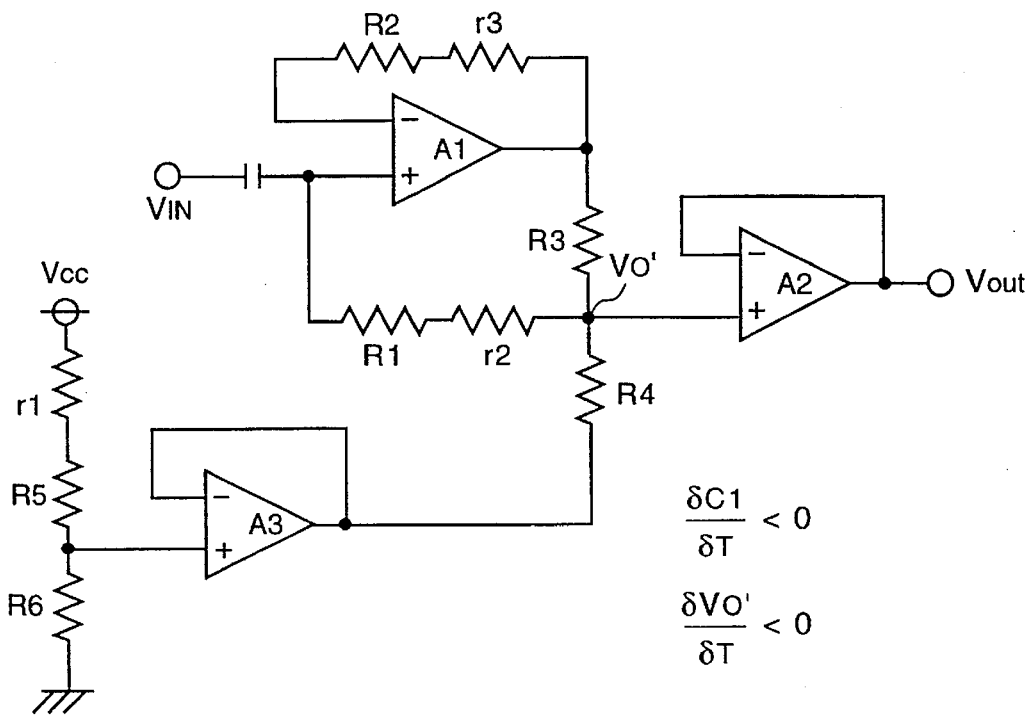
FIG. 5 is a circuit diagram showing a third example of the temperature compensation method.
Figure 6:
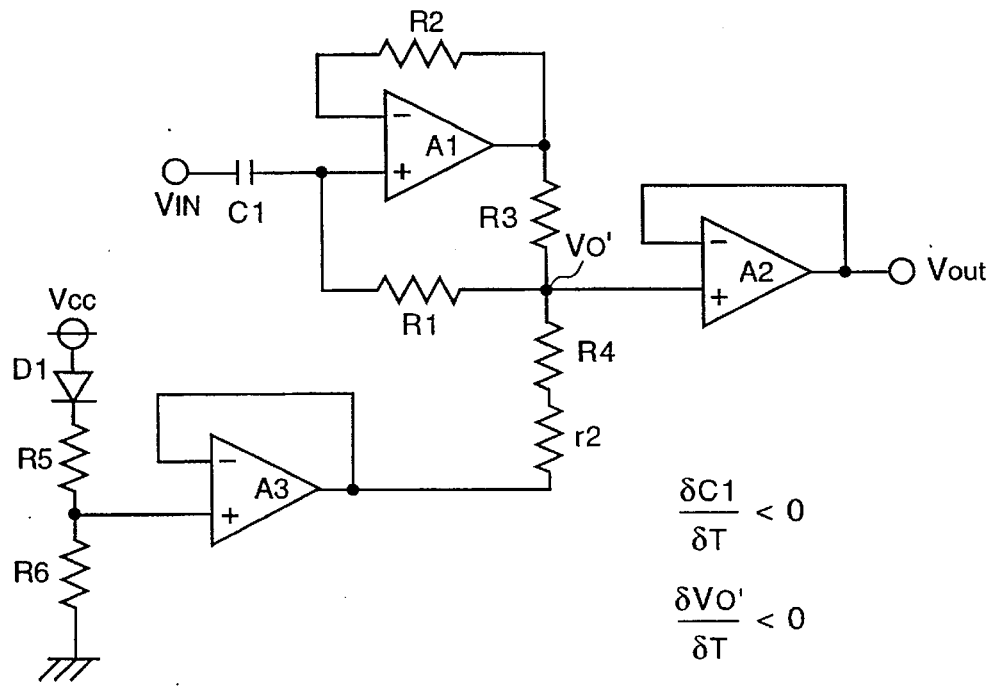
FIG. 6 is a circuit diagram showing a fourth example of the temperature compensation method.
Figure 7:
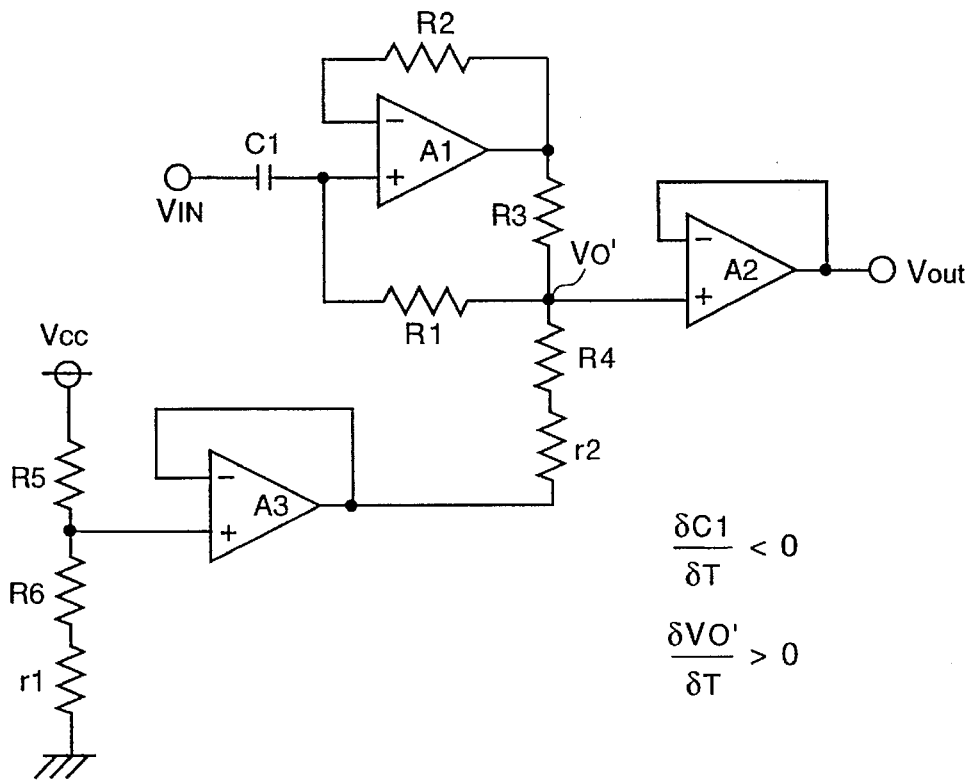
FIG. 7 is a circuit diagram showing a fifth example of the temperature compensation method.
Figure 8:
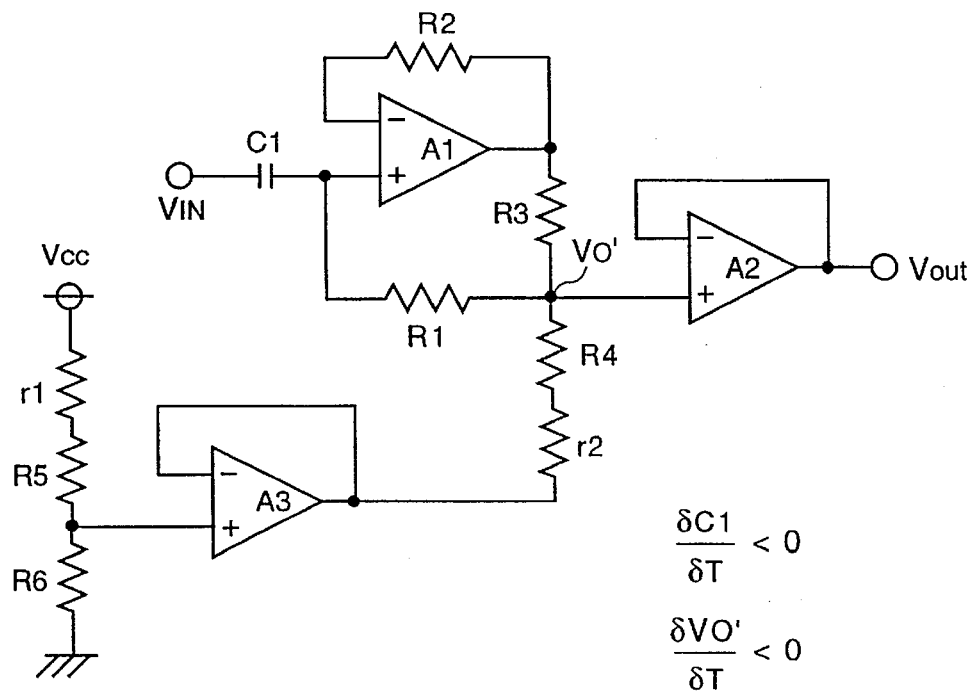
FIG. 8 is a circuit diagram showing a sixth example of the temperature compensation method.

The circuits shown in other drawings are based on the same idea. FIG. 5 and FIG. 6 show cases wherein the temperature coefficient of the capacitance of the capacitor C1 is negative, and the temperature coefficient of the electric potential $V_o'$ is negative for both cases In FIG. 5, compensation is performed by resistors in the same combination as that in the reference voltage circuit in FIG. 4. In FIG. 6, forward resistance of a diode is used instead of a resistor. Since this resistance decreases with an increase in the temperature, the reference voltage is also increased and the electric potential $V_R$ of the virtual ground is increased to perform compensation. On the contrary, FIG. 7 shows a situation wherein the temperature coefficient of the electric potential $V_o'$ is positive which can occur depending on the type of the capacitor and amplifiers used. In this case, the resistor r1 is disposed on the side of the ground contrary to the case shown in FIG. 4 to decrease the electric potential $V_R$ at the virtual ground, whereby the temperature drift in the electric potential $V_o'$ is compensated. FIG. 8 shows an alternative to the combination shown in FIG. 5.

As described above, the output of a filter circuit utilizing a capacitance amplifier circuit is sufficiently stabilized to improve the operational reliability of the circuit by compensating a temperature drift in the output of the capacitance amplifier circuit with a temperature drift in the output of a reference voltage circuit thereof. Specifically, according to the present invention, a reference voltage is coupled to a virtual ground point connected to the output of the capacitance amplifier circuit, and the reference voltage is generated by combining resistors having different temperature characteristics so that the temperature drift in the output of the capacitance amplifier circuit is canceled. Therefore, a highly accurate and stable filter circuit can be provided as described above, and a filter circuit utilizing an amplifier of a single power supply type as in the present embodiment can be used for purposes including processing of very small sensor signals such as for applications on vehicles. In addition, this circuit configuration is not limited to implementation on a substrate utilizing discrete components, and the same advantage can be obtained by forming this filter circuit in a part of an integrated circuit.

Various details of the invention may be changed without departing from its spirit nor its scope. Furthermore, the foregoing description of the embodiment according to the present invention is provided for the purpose of illustration only, and not for the purpose of limiting the invention as defined by the appended claims and their equivalents.

What is claimed is:

1. A filter circuit comprising:
   a capacitance amplifier circuit including
   a) an operational amplifier,
   b) an input capacitor having one terminal connected to an input terminal of the capacitance amplifier circuit and another terminal connected to a non-inverted input of said operational amplifier, c) an output resistance including an output resistor having a first terminal connected to an output of said operational amplifier, and d) a first feedback resistance including a resistor having a first terminal connected to said non-inverted input and a second terminal connected to a second terminal of said output resistor, said output resistance and said first feedback resistance being operative to feed output signals from said operational amplifier to said non-inverted input;

a reference voltage circuit for generating a reference voltage at an output thereof, wherein said reference voltage circuit has a plurality of resistors, said reference voltage circuit being for outputting a divided voltage formed by said plurality of resistors as said reference voltage; and a series resistor having a first terminal connected to said output of said reference voltage circuit and a second terminal connected to said second terminal of said output resistor, for forming a CR circuit with said capacitance amplifier circuit to cut off a direct component of voltage input to said input terminal in combination with said capacitance amplifier circuit, wherein at least one resistor in a group consisting of said output resistor, said resistor in said first feedback resistance, said series resistor and said plurality of resistors has a different temperature coefficient than other resistors in said group, and a drift of an output voltage from said capacitance amplifier circuit due to a change of temperature is compensated by a drift of said reference voltage responsive to said change of temperature due to said different temperature coefficient.

2. The filter circuit according to claim 1, wherein said capacitance amplifier circuit further comprises a second feedback resistance connected to an inverted input of said operational amplifier.

3. The filter circuit according to claim 2, wherein said output resistance comprises a compensating resistor and an output resistor, said compensating resistor and said output resistor being connected to each other in series, said compensating resistor having a temperature coefficient smaller than that of said output resistor.

4. The filter circuit according to claim 2, wherein said second feedback resistance includes a first compensating resistor and another resistor and said first feedback resistance further includes a second compensating resistor, said first compensating resistor being connected in series between said output of said operational amplifier and said another resistor in said second feedback resistance, and said second compensating resistor being connected in series between said resistor in said output resistance and said resistor in said first feedback resistance, said first and second compensating resistors each having a temperature coefficient smaller than that of said resistors in said first and second feedback resistances, respectively.

5. The filter circuit according to claim 1, wherein:

said at least one resistor is a resistor in said plurality of resistors, and a change in output voltage from said capacitance amplifier circuit due to a change of temperature is compensated by a drift of said reference voltage due to said different temperature coefficient responsive to said change of temperature.

6. The filter circuit according to claim 1, wherein:

said plurality of resistors included in said reference voltage circuit are connected between a constant voltage source and ground, said plurality of resistors in said reference voltage circuit including at least one resistor between said constant voltage source and said output of said reference voltage circuit and at least one resistor between said output of said reference voltage circuit and ground, and said at least one resistor between said constant voltage source and said output of said reference voltage circuit including a compensation resistor having a temperature coefficient smaller than that of said at least one resistor between said output of said reference voltage circuit and ground.

7. The filter circuit according to claim 6 wherein said reference voltage circuit includes a voltage follower comprising another operational amplifier.

8. The filter circuit according to claim 1, wherein:

said plurality of resistors in said reference voltage circuit included in said reference voltage circuit are connected between a constant voltage source and ground, said plurality of resistors in said reference voltage circuit including at least one resistor between said constant voltage source and said output of said reference voltage circuit and at least one resistor between said output of said reference voltage circuit and ground, and said at least one resistor between said output of said reference voltage circuit and ground including a compensation resistor having a temperature coefficient smaller than that of said at least one resistor between said constant voltage source and said output of said reference voltage circuit.

9. The filter circuit according to claim 8, wherein said reference voltage circuit includes a voltage follower comprising another operational amplifier.

10. A filter circuit comprising:

a capacitance amplifier circuit including an operational amplifier, an input capacitor having one terminal connected to an input terminal of the capacitance amplifier circuit and another terminal connected to a non-inverted input of said operational amplifier, an output resistance having a first terminal connected to an output of said operational amplifier, and a first feedback resistance having a first terminal connected to said non-inverted input and a second terminal connected to a second terminal of said output resistance, said output resistance and said first feedback resistance feeding output signals from said operational amplifier to said non-inverted input, said capacitance amplifier circuit producing an output at an output terminal thereof responsive to a voltage at said second terminal of said output resistance;

a reference voltage circuit for generating a reference voltage at an output thereof, wherein said reference voltage circuit has a plurality of resistors, said reference voltage circuit being for outputting a divided voltage formed by said plurality of resistors as said reference voltage; and a series resistance having a first terminal connected to said output of said reference voltage circuit and a second terminal connected to said second terminal of said output resistance, for forming a CR circuit with said capacitance amplifier circuit to cut off a direct component of voltage input to said input terminal in combination with said capacitance amplifier circuit, wherein at least one of said plurality of resistors in said reference voltage circuit has a different temperature coefficient than at least one other resistor in said plurality of resistors, and a change in output voltage from said capacitance amplifier circuit due to a change of temperature is compensated by a drift of said reference voltage due to said different temperature coefficient responsive to said change of temperature.

11. The filter circuit according to claim 10, wherein:

said plurality of resistors in said reference voltage circuit are connected in a series-connected configuration;

said reference voltage is a voltage at a predetermined point in said series-connected configuration; and said series-connected configuration has a first side, at least a portion of which is at a voltage higher than said reference voltage, and a second side, at least a portion of which is at a voltage lower than said reference voltage, said first and second sides of said series-connected configuration being separated by said predetermined point.

12. The filter circuit according to claim 11, wherein:

said at least one resistor having a different temperature coefficient has a smaller temperature coefficient than at least one other resistor in said plurality of resistors; and said at least one resistor having a different temperature coefficient is on a side of said series-connected configuration at a higher voltage than said reference voltage at said predetermined point to compensate said change in said output voltage from said capacitance amplifier circuit when said coefficient of said at least one resistor is negative.

13. The filter circuit according to claim 12, wherein said at least one resistor having a different temperature coefficient is a thin film resistor and said at least one other resistor is a diffused resistor.

14. The filter circuit according to claim 11, wherein:

said at least one resistor having a different temperature coefficient has a smaller temperature coefficient than said at least one other resistor in said plurality of resistors; and said at least one resistor having a different temperature coefficient is on a side of said series-connected configuration at a lower voltage than said reference voltage at said predetermined point to compensate a change in output of said capacitance amplifier circuit when said output voltage from said capacitance amplifier circuit rises due to a rise in temperature.

15. The filter circuit according to claim 14, wherein said at least one resistor having a different temperature coefficient is a thin film resistor and said at least one other resistor is a diffused resistor.

16. The filter circuit according to claim 11, wherein said output resistance comprises an output resistor and a compensating resistor connected in series with one another, said compensating resistor having a temperature coefficient smaller than that of said output resistor to compensate a positive temperature coefficient of said input capacitor.

17. The filter circuit according to claim 11, wherein said first feedback resistance comprises a feedback resistor and a compensating resistor connected in series with one another, said compensating resistor having a temperature coefficient smaller than that of said resistor of said first feedback resistance to compensate a negative temperature coefficient of said input capacitor.

18. The filter circuit according to claim 11, wherein said series resistance comprises a series resistor and a compensating resistor connected in series with one another, said compensating resistor having a temperature coefficient smaller than that of said series resistor to compensate a negative temperature coefficient of said input capacitor.

19. The filter circuit according to claim 10, wherein:

said different temperature coefficient of said at least one of said resistors is a first temperature coefficient;

a cutoff frequency of said filter circuit is given by the equation $$f = \frac{1}{2\pi \cdot \frac{R_f}{R_o} \cdot C \cdot R_S}$$

where f is said cutoff frequency, $R_f$ is a resistance value of said first feedback resistance, $R_o$ is a resistance value of said output resistance, C is a capacitance value of said input capacitor and $R_s$ is a resistance value of said series resistance;

at least one of said output resistance, said first feedback resistance and said series resistance has a second temperature coefficient different from said first temperature coefficient; and a change in said cutoff frequency f due to a change in temperature is collectively compensated by said input capacitor, said output resistance, said first feedback resistance and said series resistance due to said second temperature coefficient.

20. The filter circuit according to claim 19, wherein said reference voltage circuit includes a voltage follower comprising another operational amplifier.

21. The filter circuit according to claim 19, wherein said capacitance amplifier circuit further comprises a second feedback resistance connected to an inverted input of said operational amplifier.

22. The filter circuit according to claim 21, wherein said output resistance comprises a compensating resistor and an output resistor, said compensating resistor and said output resistor being connected to each other in series, said compensation resistor having a temperature coefficient smaller than that of said output resistor.

23. The filter circuit according to claim 21, wherein:

said second feedback resistance includes a first compensation resistor and another resistor;

said first feedback resistance includes a second compensating resistor and a third resistor;

said first compensating resistor is connected in series between said output of said operational amplifier and said another resistor in said second feedback resistance;

said second compensating resistor is connected in series between said output resistance and said third resistor in said first feedback resistance; and said first and second compensating resistors each have a temperature coefficient smaller than that of said another resistor and said third resistor in said first and second feedback resistances, respectively.

24. The filter circuit according to claim 19, wherein;

said plurality of resistors included in said reference voltage circuit are connected between a constant voltage source and ground, said plurality of resistors in said reference voltage circuit including at least one resistor between said constant voltage source and said output of said reference voltage circuit and at least one resistor between said output of said reference voltage circuit and ground, and said at least One resistor between said constant voltage source and said output of said reference voltage circuit including a compensation resistor having a temperature coefficient smaller than that of said at least one resistor between said output of said reference voltage circuit and ground.

25. The filter circuit according to claim 19, wherein:

said plurality of resistors included in said reference voltage circuit are connected between a constant voltage source and ground, said plurality of resistors in said reference voltage circuit including at least one resistor between said constant voltage source and said output of said reference voltage circuit and at least one resistor between said output of said reference voltage circuit and ground, and said at least one resistor between said output of said reference voltage circuit and ground including a compensation resistor having a temperature coefficient smaller than that of said at least one resistor between said constant voltage source and said output of said reference voltage circuit.

* * * * *